(12) United States Patent
Nebrigic et al.

(10) Patent No.: US 6,731,512 B2
(45) Date of Patent: May 4, 2004

(54) ACTIVE PACKAGE FOR INTEGRATED CIRCUIT

(75) Inventors: Dragan Danilo Nebrigic, Indian Springs, OH (US); Milan Marcel Jevtitch, Cincinnati, OH (US); Chow-Chi Huang, West Chester, OH (US); Kendall William Kerr, Okeana, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 0 days.

(21) Appl. No.: 10/101,802

(22) Filed: Mar. 20, 2002

(65) Prior Publication Data

US 2003/0179550 A1 Sep. 25, 2003

(51) Int. Cl.$^7$ ................................................. H05K 1/18
(52) U.S. Cl. .......................... 361/763; 361/764; 361/766
(58) Field of Search ........................ 361/760–766, 361/809–810, 823–824, 306.1, 306.2, 306.3; 29/842–844

(56) References Cited

U.S. PATENT DOCUMENTS

| | | | | |
|---|---|---|---|---|
| 4,499,519 A | * | 2/1985 | Fishman | 361/306.2 |
| 4,639,826 A | | 1/1987 | Val et al. | |
| 5,095,402 A | * | 3/1992 | Hernandez et al. | 361/306.2 |
| 5,103,283 A | * | 4/1992 | Hite | 257/724 |
| 5,261,157 A | * | 11/1993 | Chang | 29/844 |

FOREIGN PATENT DOCUMENTS

WO    WO/99/52168    4/1999

\* cited by examiner

Primary Examiner—Kamand Cuneo
Assistant Examiner—Tuan Dinh
(74) Attorney, Agent, or Firm—Welsh & Katz, Ltd.

(57) ABSTRACT

An active package for an integrated circuit may include an integrated circuit and an active component that is part of the circuit topology for the integrated circuit. The active component forms at least a portion of the housing for the integrated circuit. The integrated circuit may be housed in a shell formed by one or more discrete components. The active package may be formed in the same geometry and dimensions as a standard passive integrated circuit package, or may be formed in a shape to fit inside a standard or specially made battery package, or for another special application. A smart component may include a discrete component or a semiconductor-based resistor, capacitor or inductor, and a separate integrated circuit housed in the same housing as the discrete component or a semiconductor-based resistor, capacitor or inductor. The integrated circuit may control at least one electrical parameter of the discrete component or a semiconductor-based resistor, capacitor or inductor. In one embodiment, the integrated circuit may maintain the resistance, resistivity, capacitance, inductance, etc. of the component inside a narrow range in order to create a high-precision component regardless of changes in environmental changes such as temperature, pressure, humidity, etc.

11 Claims, 14 Drawing Sheets

ACTIVE PACKAGE FOR INTEGRATED CIRCUIT

FIELD OF THE INVENTION

This invention relates to an active package for an integrated circuit and a discrete component. More particularly, the invention relates to an active package for an integrated circuit in which the package comprises a discrete component as part of the housing for the integrated circuit.

BACKGROUND OF THE INVENTION

A typical assembled circuit, such as a PCB assembled circuit, includes an integrated circuit individually packaged in a passive plastic or ceramic package that encapsulates and protects an integrated circuit, and one or more discrete component such as a resistor, capacitor or inductor that is assembled together with the integrated circuit onto a PCB circuit board. The assembled circuit, such as a power circuit, microprocessor, memory application, logic device, rf amplifier, etc., also generally includes transmission lines printed on the circuit board substrate and soldered interconnects that lead to parasitic losses due to the inherent resistance, capacitance and inductance of the transmission lines and soldered interconnects. These parasitic losses greatly increase in circuits that operate at high switching speeds. In order to minimize the parasitic losses, circuit designers have moved the circuit components closer together on the circuit board. Although the parasitic loss due to the transmission lines may be decreased, placing the components in close proximity may result in energy radiation, such as electromagnetic or heat, generated by one or more of the components may interfere with the operation of another component. In addition, higher current handling system designs face unique problems such as larger component size requirements due to potential dielectric or insulation breakdowns, energy storage requirements, heat dissipation, high transmission line losses, especially for switching converters where it affects the power conversion efficiency as well as voltage conversion efficiency and higher efficiency constraints.

Power circuits, such as switching power converters, linear regulators, power integrators, charge pumps, op amp circuits, comparator circuits, relay driver circuits, relay actuation circuits, power integration circuits with power monitoring and power control, proximity switches, etc., for example, typically include one or more power converting or regulation component and one or more intrinsic energy conversion, storage or conservation component that are individually packaged and assembled together on a single PCB substrate and/or inside a passive plastic or ceramic package (e.g., hybrid packages). A switching converter may include a charge pump integrated circuit, a flying capacitor and a storage capacitor or a plurality of capacitors that make up a flying or storage capacitor. The various components may generate electromagnetic or heat energy radiation that may affect the operation of other components. In order to dissipate the heat generated, many power circuits include a heat sink attached to the plastic or ceramic package that houses the power converting or regulation component (e.g., a TO220 standard power converter package). The total size of the package including the heat sink is typically at least an order of magnitude larger than the size of the integrated circuit itself depending upon the power dissipation, the power carrying capability and the number of pins required.

SUMMARY OF THE INVENTION

The present invention includes an integrated circuit package including an active component that is part of the circuit topology of the integrated circuit and forms at least a part of the housing for the integrated circuit. In one embodiment, for example, the integrated circuit may be housed in a shell formed by one or more discrete components to form an package in which the discrete component is an element of the circuit including the integrated circuit. The active package may be formed in the same geometry and dimensions as a standard passive integrated circuit package, may be formed in a shape to fit inside a standard or specially made battery package, or may be formed in a size and shape to fit in a device or to form a part of the chassis of the device.

In an alternative embodiment of the present invention, a smart component may include a discrete component or a semiconductor-based resistor, capacitor or inductor, and a separate integrated circuit housed in the same housing as the discrete component or a semiconductor-based resistor, capacitor or inductor. The integrated circuit may control at least one electrical parameter of the discrete component or a semiconductor-based resistor, capacitor or inductor. In one embodiment, for example, the integrated circuit may maintain the resistance, resistivity, capacitance, inductance, etc. of the component inside a narrow range in order to create a high-precision component regardless of changes in environmental changes such as temperature, pressure, humidity, etc.

DETAILED DESCRIPTION OF THE INVENTION

Figure 1:
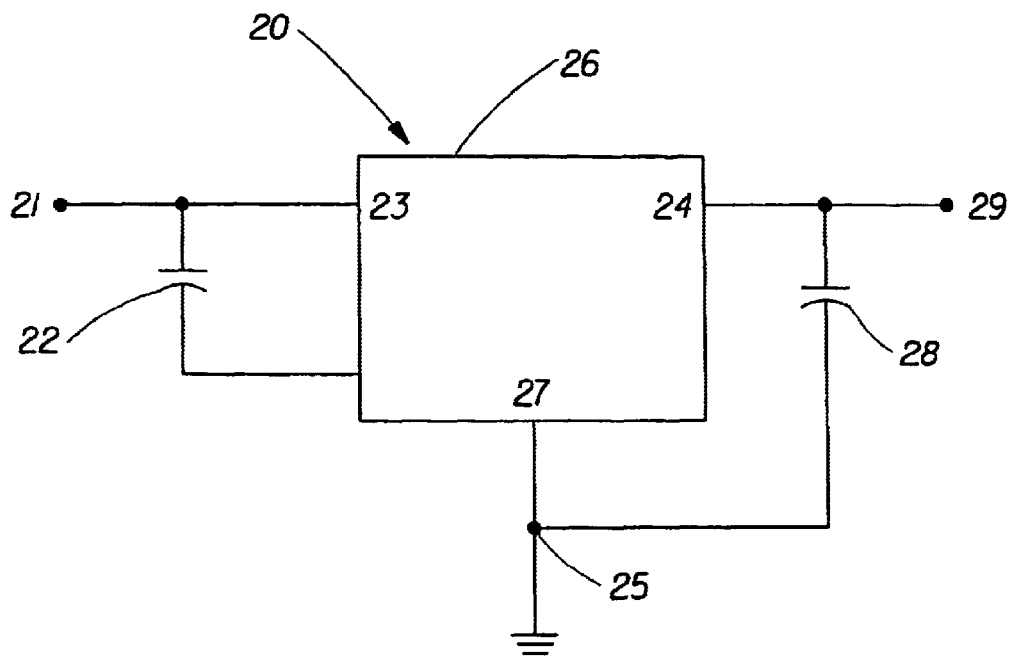
FIG. 1 shows a schematic representation of a power integrator circuit including a charge pump power converter.

An active package as used in this application refers to a package for at least one integrated circuit and at least one discrete component that is part of the same circuit with the integrated circuit. The active package includes at least one discrete component as part of the housing for the one or more integrated circuit. An active package may include one or more integrated circuit along with one or more discrete component. An integrated circuit refers to a semiconductor chip including electronic elements fabricated into the chip or onto the surface of the chip (e.g., silicon, GaAs, SiGe, SiC). The term discrete component refers to a resistor, a capacitor or an inductor that is not fabricated on an integrated circuit. A high efficiency capacitor refers to capacitors having relatively low charge leakage and very low ESR (equivalent serial resistance) and low dynamic serial resistance, for example, double layer electrolytic capacitors (e.g., capacitors known as super-capacitors, ultra-capacitors and power capacitors) and pseudo capacitors.

A smart component include a discrete component or, in one alternative embodiment, a semiconductor-based resistor, capacitor or inductor having at least one semiconductor chip that controls at least some portion of the operation of the discrete component housed inside the housing of the discrete component. A smart component may, for example, include a controller that monitors environmental conditions such as pressure, temperature, humidity, etc. and optimize the performance of the discrete component based upon the condition. A smart component may, for example, provide a single-piece precision discrete component that is able to maintain its desired electrical properties such as resistance, capacitance or inductance within a tight tolerance level regardless of changing environmental conditions. A smart component may be transparent to the circuit in which the discrete component is a part, or may provide an input to the circuit.

An assembled circuit may include discrete components that are intrinsic and/or extrinsic to the circuit topology. As used in this application, an intrinsic component is a discrete component that performs a function integral with the function of the circuit. In a power integrator, for example, a resistor, a flying capacitor, a storage capacitor or an inductor perform an energy conversion, storage and/or conservation role that is required for the power integrator to operate as designed. An extrinsic component, however, refers to a discrete component that is not integral with the function of the circuit. An extrinsic component may be used to enhance the operation of the circuit. A filter capacitor, for example, may be connected between an input or output terminal and ground to enhance the operation of an assembled circuit, but is not required for the circuit to operate as designed and, as such, represents an added cost to the overall circuit design.

An active package of the present invention may significantly reduce the cost and complexity of packaging and assembling an integrated circuit. By using an active component as a housing or shell for an integrated circuit, the present invention may eliminate passive material otherwise required to package the integrated circuit. In addition, an embodiment of the present invention that uses an intrinsic component of the assembled circuit instead of an extrinsic component may reduce the number of active components used in the circuit and may correspondingly reduce the finished cost of the assembled circuit. Using all the intrinsic components of the assembled circuit in the housing or shell may also significantly reduce costs even more because the chip packaging and the circuit assembling may be performed in the same step. Where the components are able to be mechanically interconnected, the present invention may also allow for reduced or eliminated use of solder. This, in turn, may further reduce costs of assembly and allow for more environmentally-friendly products due to the reduction or elimination of lead used in the solder. Where the intrinsic component, such as a flying or storage capacitor of a power converter, may also perform a function that may otherwise be performed by an extrinsic component, such as a filter capacitor, this also results in further cost savings because the cost of the extrinsic component may be eliminated.

An active package may also allow for a boardless design of an assembled circuit because the discrete components are used as the integrated circuit packaging elements. An active package may include multiple integrated circuits at least partially housed in or by a discrete component. For example, a multiple chip module may be replaced by an active package of the present invention that includes two or more integrated circuits housed in an active package of the present invention. Although not required, in one embodiment one or more integrated circuits and/or discrete components may be assembled on a PCB board that is housed within an active package of the present invention.

Figure 9:
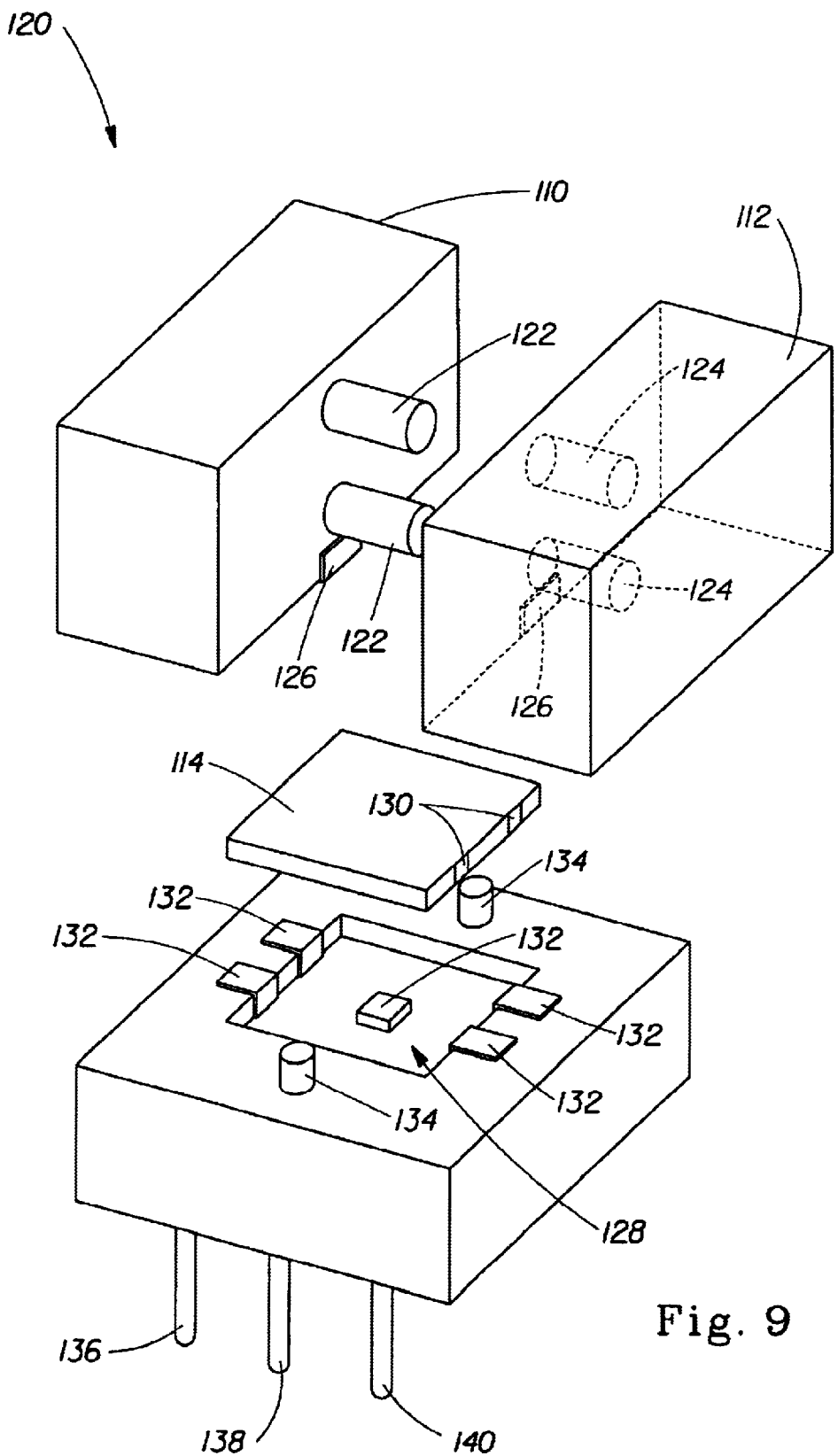
FIG. 9 shows a simplified exploded view of an active package design of the present invention that houses the power converter circuit shown in FIG. 7.
Figure 10:
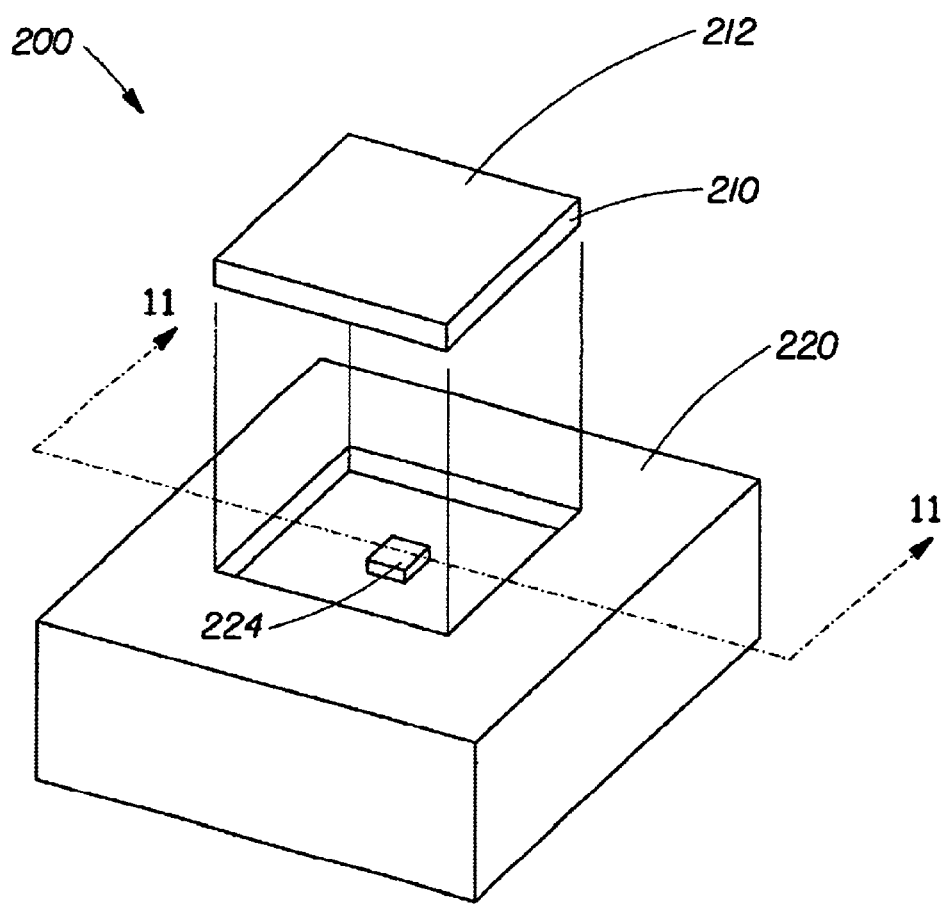
FIG. 10 shows a simplified exploded view of an active package design of the present invention including an integrated circuit and a single discrete component.
Figure 11:
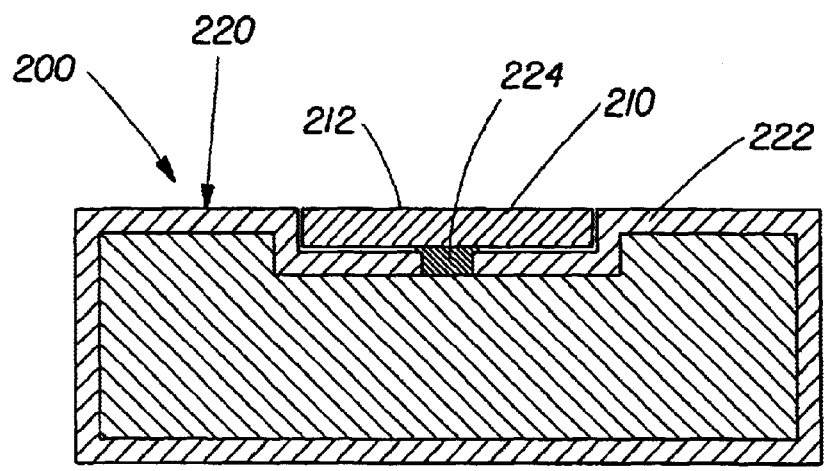
FIG. 11 shows a sectional view taken of the active package design of FIG. 10 along section line XI—XI.

In one embodiment of the present invention, an active package may include a "shell" structure that includes a top shell and/or a bottom shell. In the embodiment including a dual-sided shell design such as the design shown in FIGS. 4–6 and 9, the two shell sides may encapsulate an integrated circuit. In a single-sided shell design, such as shown in FIGS. 10 and 11, the shell side may protect one side of an integrated circuit. The other side of the integrated circuit may be protected by a passive packaging material such as plastic or ceramic material, or may be self-protecting such as a flip-chip. A shell side may include a single discrete component that protects one side of an integrated circuit such as the top shell designs shown in FIGS. 4–6 and the bottom shell design shown in FIGS. 4–6 and 9–11. Alternatively, the shell side may comprise multiple discrete components that are attached together to form a single side of a shell such as the top shell design shown in FIG. 9.

Active components used in the housing or shell may also be used as a heat sink for the integrated circuit and, in many cases, may eliminate the need for an external heat sink altogether. A capacitor, a resistor or an inductor that is housed adjacent to the semiconductor chip may distribute and dissipate heat generated in the semiconductor chip more efficiently than a typical plastic or ceramic packaging material. In addition, the discrete component used as the housing or shell may also include a metal casing or layer that may further aid in dissipating heat from the active package. Further, the discrete components may also be configured so that the active package may be attached to a conventional heat sink. A component may, for example, include a hole similar to those of typical integrated circuit packaging designs that may be used to attach the active package to a heat sink. An active package of the present invention may also enable an integrated chip to operate at the lower temperature than typical because the parasitic dissipation may "warm up" the semiconductor chip.

An active package of the present invention may also allow for higher noise immunity and may allow for use of parasitic elements as part of the circuit. By encapsulating a larger part, or even the entire part, of the circuit may allow for higher noise immunity of the circuit and may reduce the noise generated by the circuit that affects other nearby circuits. Also, the proximity of the semiconductor chip to the other components may lead to more predictable parasitic elements of the circuit that may be utilized in the design of the circuit.

An active package design of the present invention may also be scaleable, i.e., multiple active package designs may be connected together. In this embodiment, the combination of active package designs may allow for an interconnecting board-less circuit in which all the circuit elements are interconnected in one package. In a particular embodiment, this package may form a portion of the chassis of a device that houses the electronic circuitry for that device or may even form all or a portion of the chassis of the device.

An embodiment of the present invention may also include a discrete component that responds to or senses an environmental condition such as pressure, temperature, humidity, etc., or a change in the environmental condition. The circuit may detect this condition or change in condition and respond by optimizing the operation of the circuit to maximize the performance of the circuit. The circuit component may include, for example, a thermistor, temperature diode, a capacitor, or an inductor that responds to a change in temperature by a change in the resistance, capacitance or inductance of the component. The circuit may detect this change and use the change as a feedback signal to optimize the performance of the circuit.

Any circuit having including an integrated circuit and one or more intrinsic discrete components may be configured into an active package of the present invention. A power integrator including a charge pump integrated circuit, a flying capacitor and a storage capacitor, for example, includes two discrete components that may form a shell to house the charge pump integrated circuit. FIG. 1 shows a simplified schematic representation of a power integrator circuit 20 including a charge pump 26, a flying capacitor 22 and a storage capacitor 28. In the power integrator circuit 20, the flying capacitor 22 is electrically connected between the input terminal 21 of the power integrator circuit 20 and the neutral terminal 25 of the power integrator circuit 20. The charge pump 26 has an input terminal 23, a neutral terminal 27 and an output terminal 24. The input terminal 23 of the charge pump 26 is electrically connected to the input terminal 21 of the power converter circuit 20. The output terminal 24 of the charge pump 26 is electrically connected to the output terminal 29 of the power integrator circuit 20. The neutral terminal 27 of the charge pump 26 is electrically connected to the neutral terminal 25 of the power integrator circuit 20. The storage capacitor 28 is electrically connected between the output terminal 29 of the power integrator circuit 20 and the neutral terminal 25 of the power integrator circuit 20.

Figure 2:
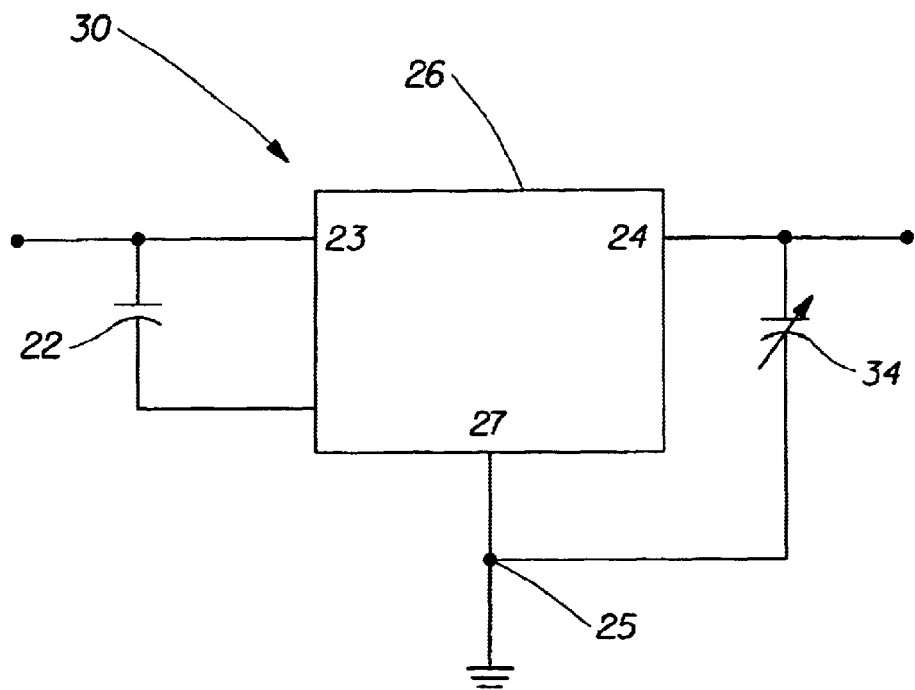
FIG. 2 shows an alternative embodiment of a power integrator circuit including a charge pump power converter.

In an alternative embodiment, the power converter circuit may include a component that includes an environmental condition sensor or a component that changes parameters in response to a change in an environmental condition such as pressure, temperature, humidity, etc. (e.g., a capacitor that changes capacitance as the temperature varies). FIG. 2, for example, shows an alternative embodiment of a power integrator circuit 30 to the power integrator circuit 20 shown in FIG. 1 in which the storage capacitor 38 may include a temperature sensing element, and/or the capacitor may change capacitance as the temperature varies (alternatively, the flying capacitor may be used to detect a change in temperature). As the temperature of the charge pump integrated circuit or of the environment varies, the charge pump 26 may detect a change in the capacitance of the storage capacitor 38 or receive an input from the temperature sensing element and vary the operation of the charge pump 26 such as by changing the duty cycle of the converter to optimize the performance of the circuit. In this embodiment, for example, the utilization of a temperature sensor or a change in capacitance may allow for better system controller performance due to the measurable dissipation information available as feedback for real time circuit operating conditions. Alternatively, the capacitor of this circuit may comprise a smart-component capacitor in which the capacitor may include an integrated circuit that monitors one or more environmental conditions and optimizes the performance of the capacitor to keep it in a desired range of performance. Other embodiments of a power converter including a charge pump that may be housed in an active package of the present invention are described in U.S. Provisional Application No. 60/141,119 entitled "Battery Having a Built-In Dynamically Switched Capacitive Power Converter" filed on Jun. 25, 1999 by Nebrigic and Gartstein, which is incorporated by reference into this application. Other power integrators incorporating a charge pump that are known in the art may also be housed in an active package of the present invention.

Figure 3:
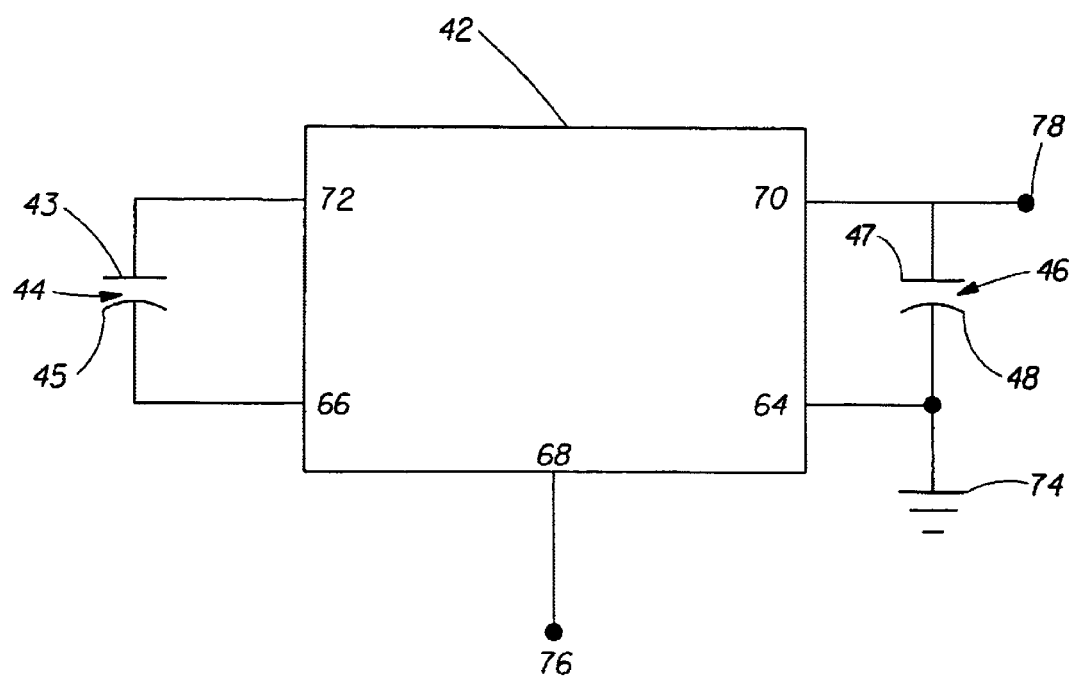
FIG. 3 shows a schematic block diagram of a power integrator circuit including a charge pump that may be housed in an active package of the present invention.
Figure 4:
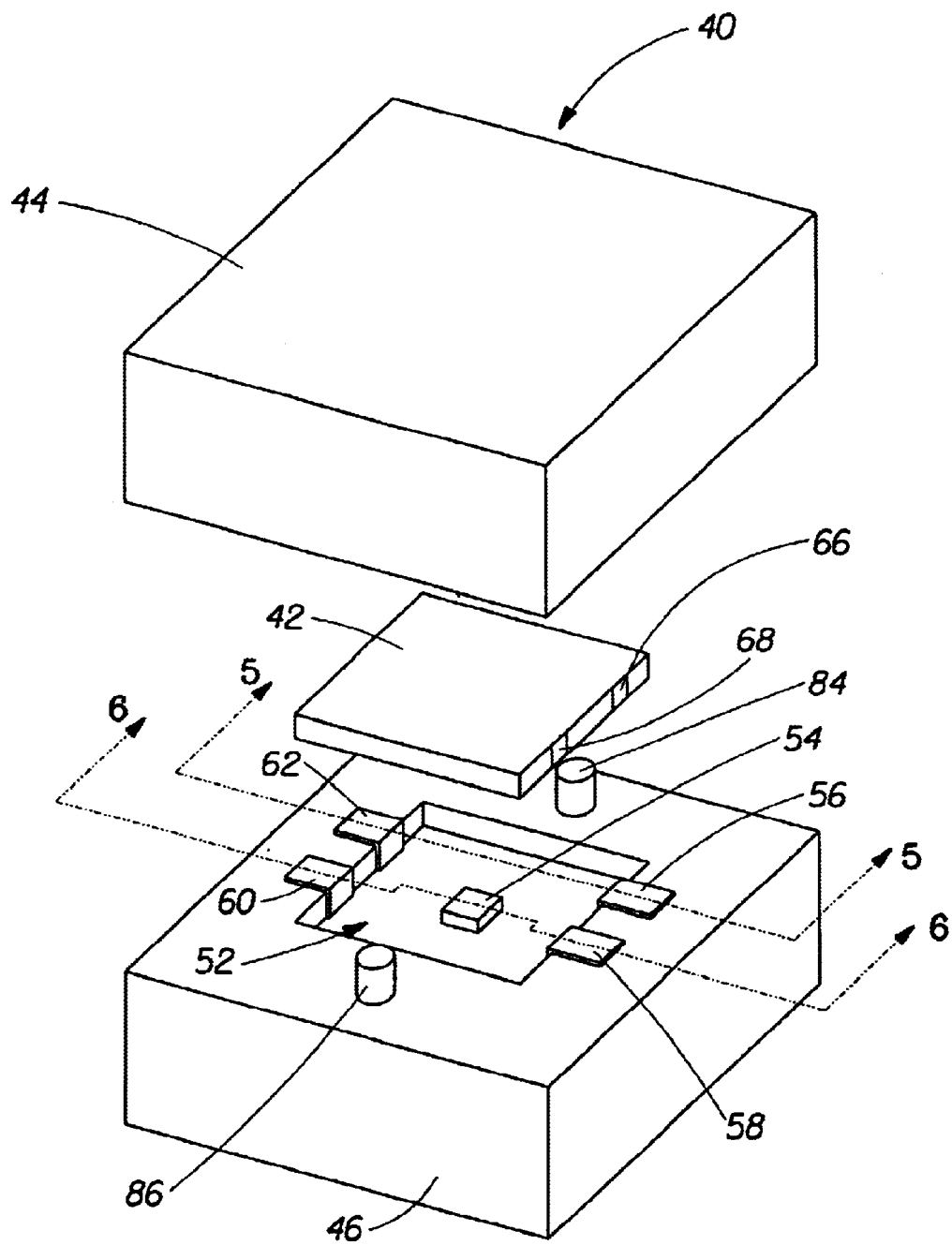
FIG. 4 shows a simplified exploded view of one embodiment of an active package design for the power integrator circuit shown in FIG. 3.
Figure 5:
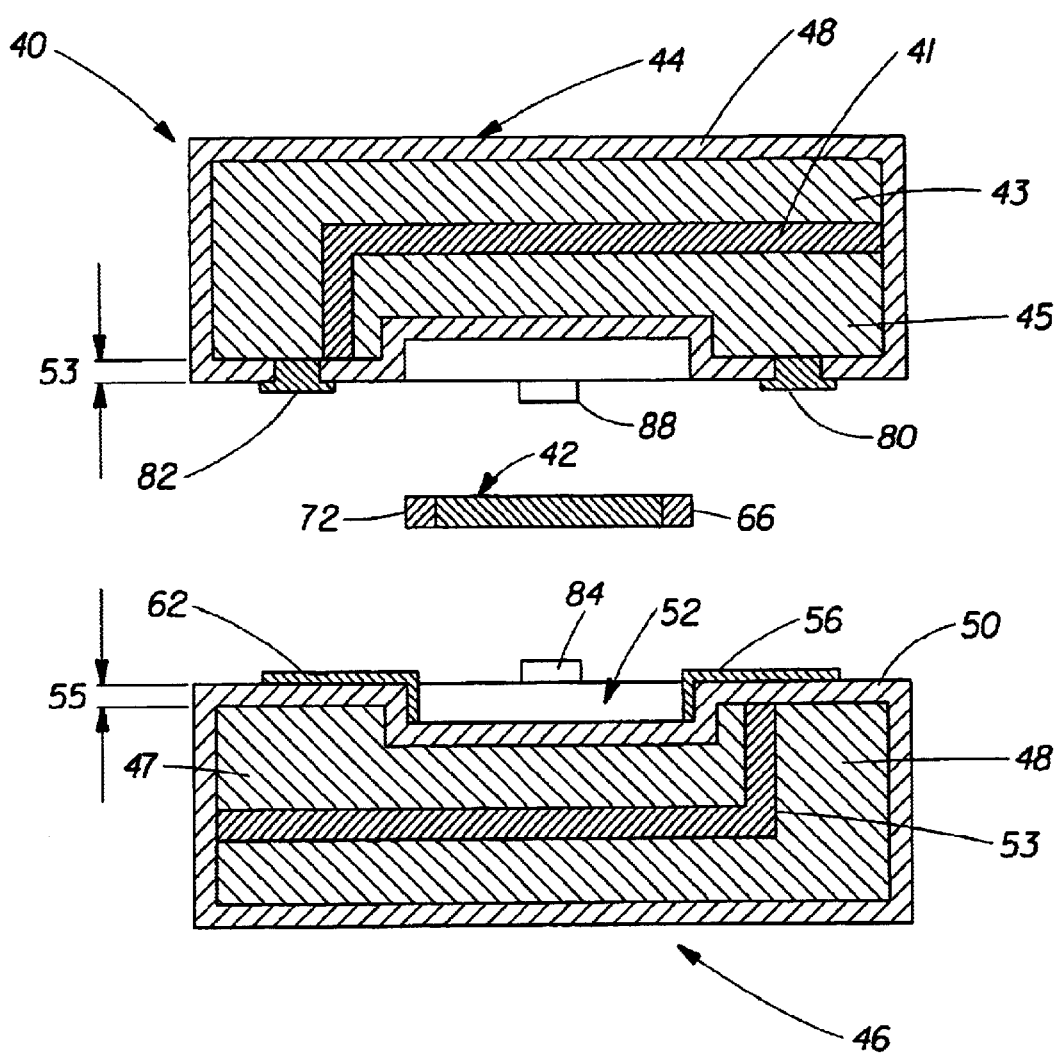
FIG. 5 shows a simplified exploded cross-sectional view taken along section lines V—V of FIG. 4.
Figure 6:
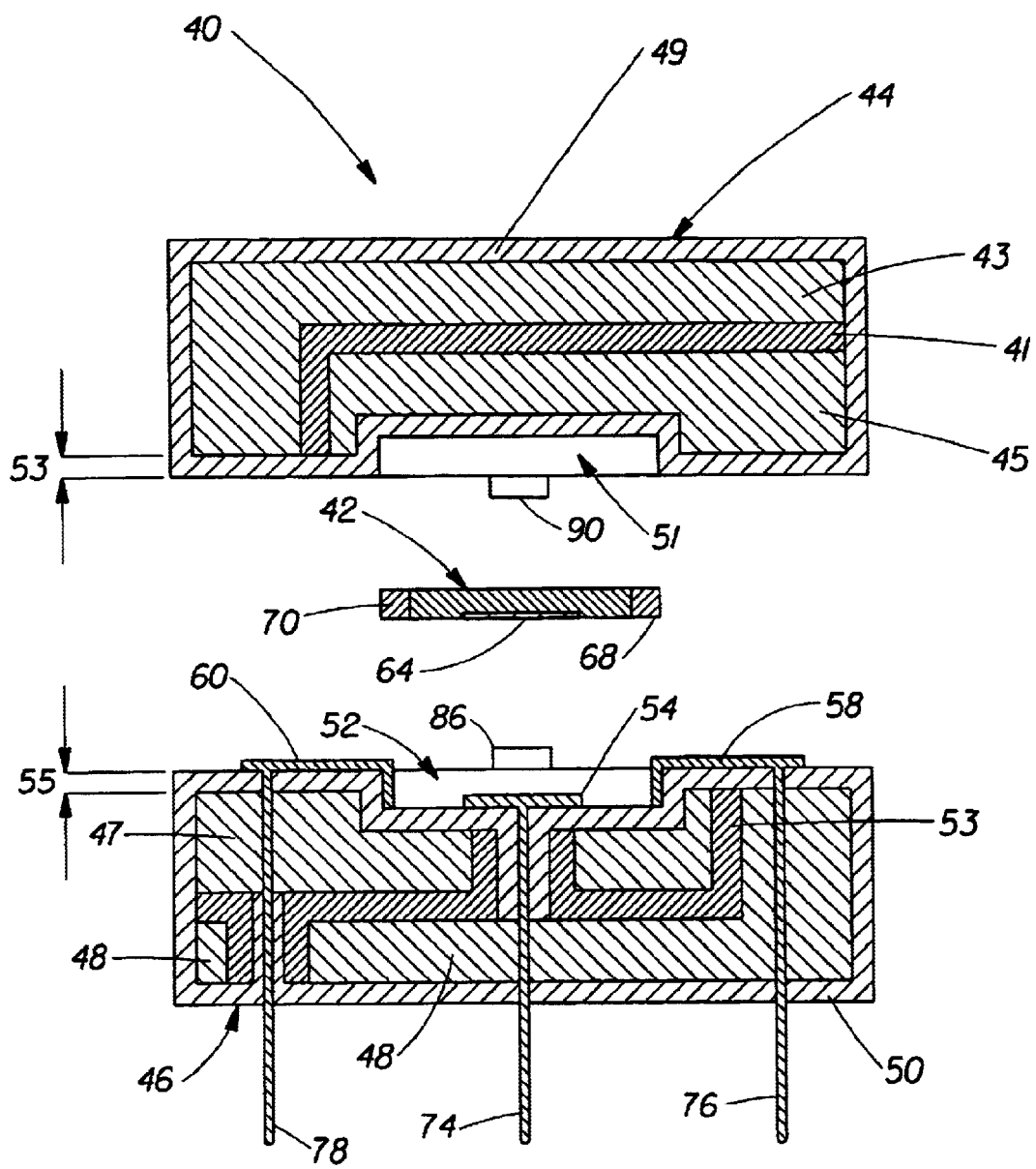
FIG. 6 shows a simplified exploded cross-sectional view taken along section lines VI—VI of FIG. 4.

FIG. 3 shows a schematic block diagram of a power integrator circuit including a charge pump integrated circuit 42, a flying capacitor 44 and a storage capacitor 46 that may be housed in an active package of the present invention. FIG. 4 shows a simplified exploded view of one embodiment of an active package design 40 for the power integrator circuit shown in FIG. 3. FIGS. 5 and 6 show two simplified exploded cross-sectional views taken along section lines V—V and VI—VI of FIG. 4, respectively. The active package 40 includes a power integrator with a charge pump converter circuit having a charge pump integrated circuit 42, a flying capacitor 44 and a storage capacitor 46. In this embodiment, the charge pump integrated circuit 42 is located between the storage capacitor 46, which provides a substrate upon which the charge pump integrated circuit 42 is located and forms one side of the active package 40 shell, and the flying capacitor 44, which forms the second side of the active package 40 shell. The positions of the capacitors 44 and 46 may be reversed. The flying capacitor 44 and/or the storage capacitor 46 may include a recess, such as recesses 51 and 52, in which the charge pump integrated circuit 42 may be partially or fully housed. The recess(es) 51 and 52 may include a dimple, a notch or a cavity or etched groove formed in one or both of the capacitors 44 and 46. The recess(es) 51 and 52 may be milled, etched, molded, etc.

The storage capacitor 46 and/or the flying capacitor 44 may be fully or partially encased by an insulator material. In one embodiment, the thickness 53 and 55 of the insulators 49 and 50 at least on the side of one or both of the capacitors 44 and 46 that is adjacent to the charge pump integrated circuit 42 may be calculated to prevent an electromagnetic or field generated either by the charge pump integrated circuit 42 or a capacitor 44 or 46 from extending into the other component. In this embodiment, the insulators 49 and 50 prevent the components that are located in close proximity from interfering with the operation of the other component. In this embodiment, the flying capacitor 44 and the storage capacitor 46 are shown to be tantalum/polymer capacitors in which the dielectric layers 41 and 53 may be molded in order to provide easier connections between the electrodes 43, 45, 47 and 48 and the rest of the circuit without extending a pin through the dielectric layers 41 and 53 of the capacitors 44 and 46. The capacitors may, however, be other types of capacitors known in the art such as high efficiency capacitors including ultra-capacitors, super capacitor, double layer electrolytic capacitors or pseudo capacitors. The capacitors may have terminals on the surface of the capacitors in order to allow for easier electrical connections of the capacitors to the rest of the circuit.

The charge pump integrated circuit 42 may be electrically connected to the flying capacitor 44 and the storage capacitor 46 by contact pads as shown in FIG. 4. In this embodiment, the neutral terminal 64 of the charge pump integrated circuit 42 is electrically connected to the neutral pin 74 of the active package 40 by the contact pad 54. The negative electrode 45 of the flying capacitor 44 is electrically connected to the flying capacitor negative terminal 66 of the charge pump integrated circuit 42 by contact pads 56 and 80, which are brought into physical and electrical contact with each other when the active package 40 is assembled. The positive electrode 43 of the flying capacitor 44 is electrically connected to the flying capacitor positive terminal 72 of the charge pump integrated circuit 42 by contact pads 62 and 82, which are also brought into electrical and physical contact when the active package 40 is assembled. The positive input terminal 68 of the charge pump integrated circuit 42 is electrically connected to the positive input pin 76 of the active package 40 by the contact pad 58. The output terminal 70 of the charge pump integrated circuit 42 is electrically connected to the output pin 78 of the active package 40 by contact pad 60. The positive electrode 47 of the storage capacitor 46 is electrically connected to the output pin 78 of the active package 40, and the negative electrode 48 of the storage capacitor is electrically connected to the neutral pin 74 of the active package.

The active package 40 of the present invention may be assembled in a number of different ways. The charge pump integrated circuit 42, for example, may be soldered to the flying capacitor 44 and/or the storage capacitor 46, may be mechanically latched together with the flying capacitor 44 and/or the storage capacitor 46, may be snap fit into a recess such as recess 51 and/or 52 by spring forces if the terminals of the charge pump integrated circuit 42 or the contact pads of either of the capacitors in the recesses 51 and/or 52 include resilient members that hold the charge pump integrated circuit 42 in place, or may even rest in place in a recess such as recess 51 and/or 52. The charge pump integrated circuit 42 may alternatively be connected to the flying capacitor 44 and/or the storage capacitor 46 by any means known in the art. The flying capacitor 44 and the storage capacitor 46 may also be connected together in many different ways to form an active package 40 of the present invention. The capacitors, for example, may be bonded together by bonding pads such as bonding pads 84, 86, 88 and 90. The bonding pads 84, 86, 88 and 90 are insulated from the flying capacitor 44 and the storage capacitor 46 by insulators 49 and 50, respectively. Thus, the bonding pads 84, 86, 88 and 90 allow for mechanical connections between the capacitors, but not electrical connections. Alternatively, the flying and storage capacitors 44 and 46 may be soldered, mechanically interconnected, or connected by any other means known in the art.

Figure 7:
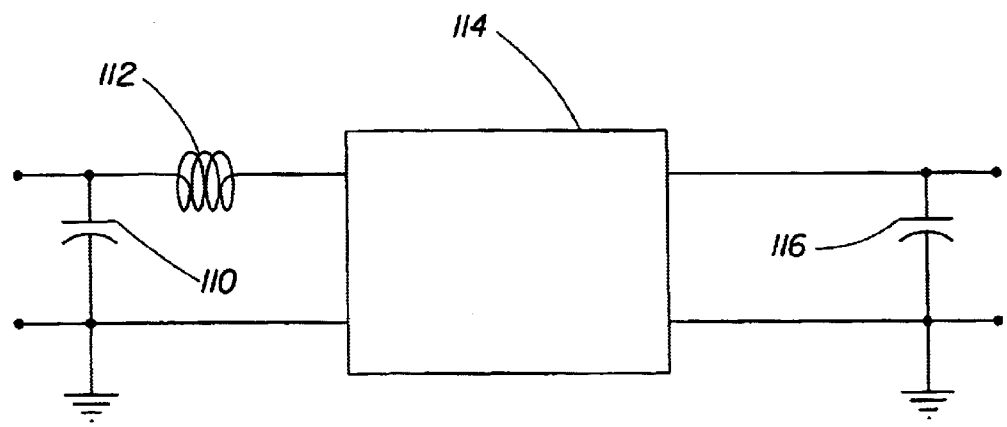
FIG. 7 shows a schematic representation of a power converter circuit including a DC/DC converter.
Figure 8:
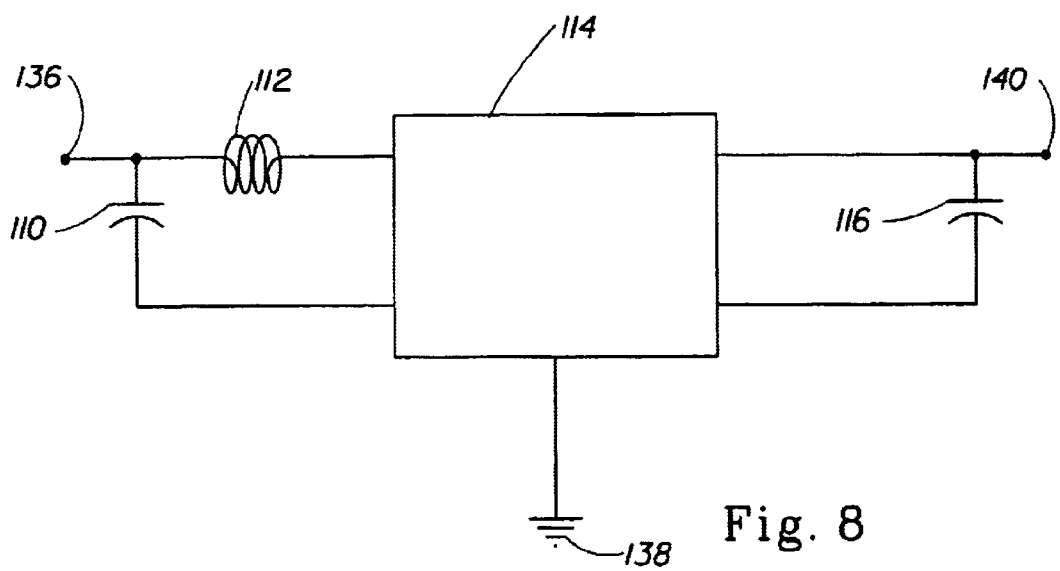
FIG. 8 shows a schematic block diagram of a circuit layout for the power converter circuit shown in FIG. 7.

An alternative embodiment of a power converter circuit 100 including a flying capacitor 110, an inductor 112, a DC/DC converter 114, and a storage capacitor 116 is shown in FIG. 7. FIG. 8 shows a schematic block diagram of a circuit layout for the power converter circuit 100 shown in FIG. 7, and FIG. 9 shows a simplified exploded view of an active package 120 of the present invention that houses the power converter circuit 100 shown in FIG. 7. In this embodiment, the flying capacitor 110 and the inductor 112 mate together and form the top shell of the active package 120 (alternatively, the flying capacitor 110 and the inductor may form the bottom shell of the active package 120). The flying capacitor 110 and the inductor 112 may be connected, for example, by the interlocking posts 122 and holes 124. The posts 122 and the holes 124 may snap-fit together or interlock by other mechanical means. The posts 122 may be insulated from the electrodes of the flying capacitor 110 and/or the holes 124 may be insulated from the inductor 112 if a purely mechanical connection is desired. In this case another form electrical contact, if needed, may be supplied. In FIG. 9, for example, contact pads 126 on the flying capacitor 110 and the inductor 112 may be used to make electrical contact between the two components. Alternatively, one or more of the posts 122 may be electrically connected to an electrode of the flying capacitor 110 and one or more of the holes 124 may be electrically connected to the inductor 112. In this way, both the mechanical and electrical connections between the flying capacitor 110 and the inductor 112 may be made by the posts 122 and the holes 124. If the discrete components are not to be directly electrically connected to each other, only mechanical connections need be made.

As shown in FIG. 9, DC/DC converter integrated circuit 114 may be located in recess 128 of storage capacitor 116. A recess may also be formed in the flying capacitor 110, the inductor 112 to house a portion or all of the DC/DC converter integrated circuit 114 in addition to or instead of the recess 128 formed in the storage capacitor 116. The DC/DC converter integrated circuit may be electrically connected to the flying capacitor 110, the inductor 112, the storage capacitor 116, the neutral pin 138 and the output pin 140 by terminals 130 and contact pads 132 as described above with respect to FIGS. 4–6. The flying capacitor 110 and the inductor 112 may be electrically connected to the input pin 136 via contact pads 132. The top and bottom shells of the active package 120 may be connected together by bonding pads 134 as described above. Alternatively, the top and bottom shells of the active package 120 may be soldered, mechanically interconnected, or connected by any other means known in the art.

Figure 22:
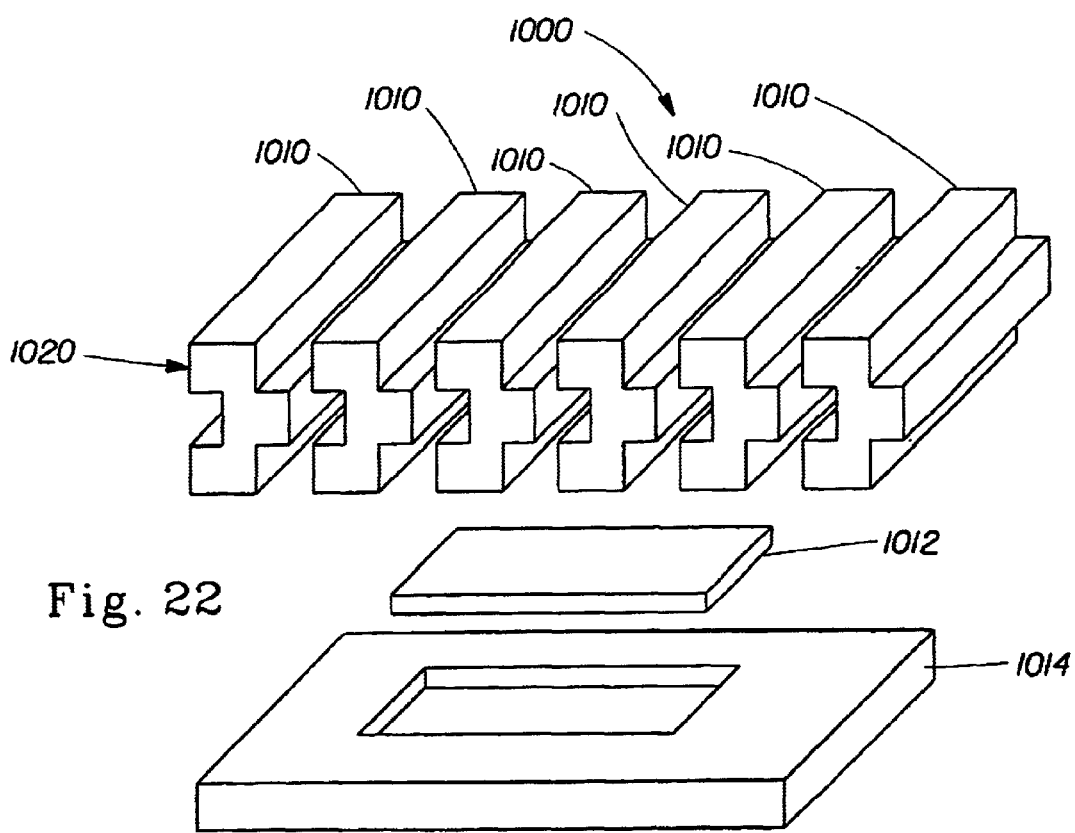
FIG. 22 shows a simplified exploded view of a further embodiment of the present invention.

In an alternative embodiment, multiple resistors, capacitors or inductors may be connected together such as in the manner shown in FIG. 9 and described above, or by any other method described in this application or known in the art, to form the desired circuit connections. In order to provide the desired resistance, capacitance or inductance values, for example, multiple resistors, capacitors or inductors may be combined together in series or in parallel. In a capacitor, for example, each post may be electrically connected to a different electrode of that capacitor, and each hole may be electrically connected to a different electrode of that capacitor. Then, the capacitors may be connected in series or in parallel depending upon which post was inserted into which hole. In addition, different types of discrete components such as the capacitor and inductor shown in FIG. 9 may be connected together to form various circuit configurations desired for a particular application. FIG. 22 shows a simplified exploded view of yet another embodiment of the present invention in which multiple discrete components 1010 may be mated together to form a single shell side 1020 that forms the top of an active package of the present invention including integrated circuit 1012 and carrier 1014. The connections shown may be snap fit configurations in which no solder is necessary and may also include purely mechanical connections in which the electrical elements of the discrete components are insulated from each other, or may also include electrical connects between the discrete components.

Figure 12:
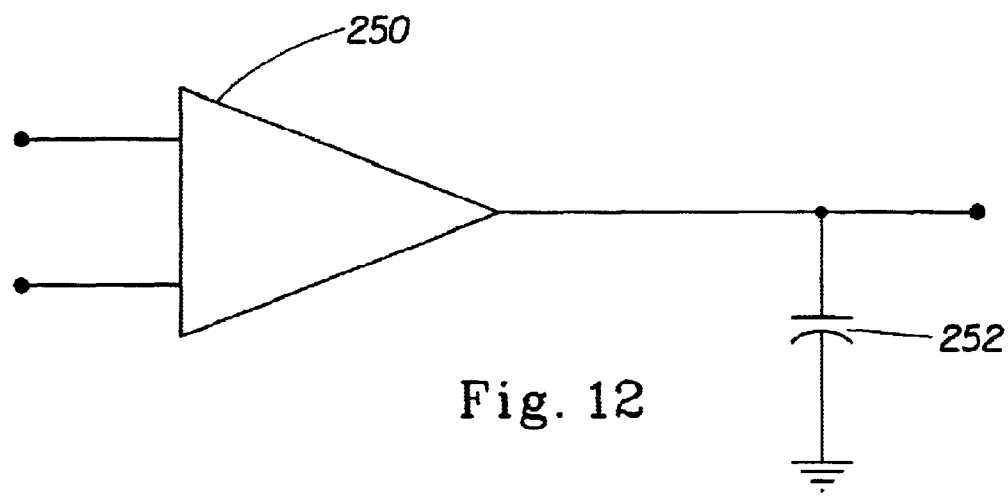
FIG. 12 shows a schematic representation of an audio op amp power amplifier circuit.

Yet another embodiment of an active package of the present invention is shown in FIGS. 10 and 11. FIG. 11 shows a sectional view taken along section line XI—XI shown in FIG. 10. In this embodiment, the active package 200 includes an integrated circuit 210 and a single discrete component 220. In this embodiment, the integrated circuit 210 could be designed with the exposed side of the integrated circuit 210 protected, such as a flip-chip design (e.g., wafer scale packaging). Alternatively, the active package 200 could include a passive packaging material such as plastic or ceramic that covers the exposed side 212 of the integrated circuit 210. The electrical and mounting connections between the integrated circuit 210 and the discrete component 220 may be any of the methods described above or any other connections known in the art. FIG. 11, for example, shows an exemplary electrical contact pad 224 that extends through insulator layer 222 of the discrete component 220. Discrete component 220 may be one or more capacitor, inductor and or/resistor or a combination of one or more capacitor, inductor and/or resistor. An example of a circuit that may be housed in an active package 200 design that includes a single discrete component is an audio op amp power amplifier circuit. A circuit schematic for an audio op amp power amplifier circuit that may be housed in an active package design such as the active package design 200 is shown in FIGS. 12.

Battery Top

Figure 13:
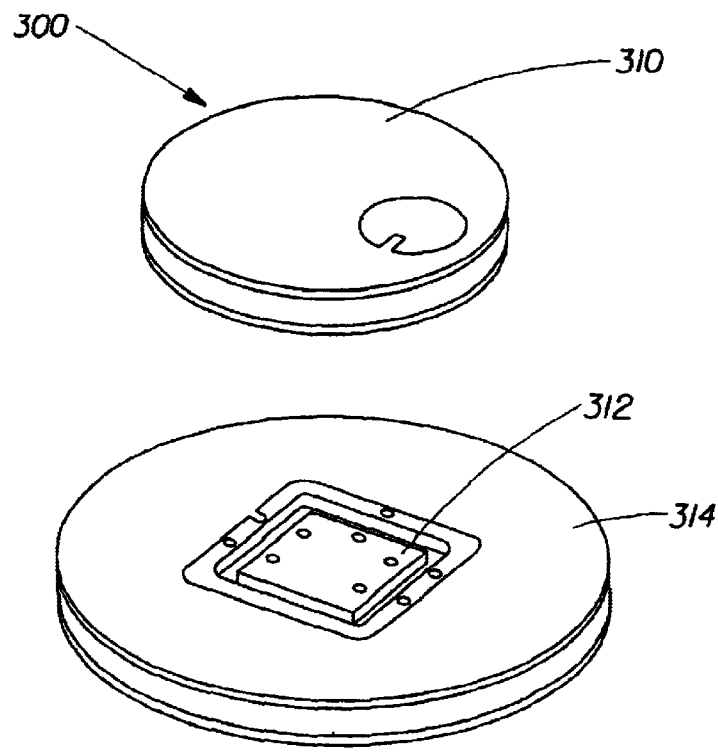
FIG. 13 shows an alternative embodiment of an active package design of the present invention.
Figure 14:
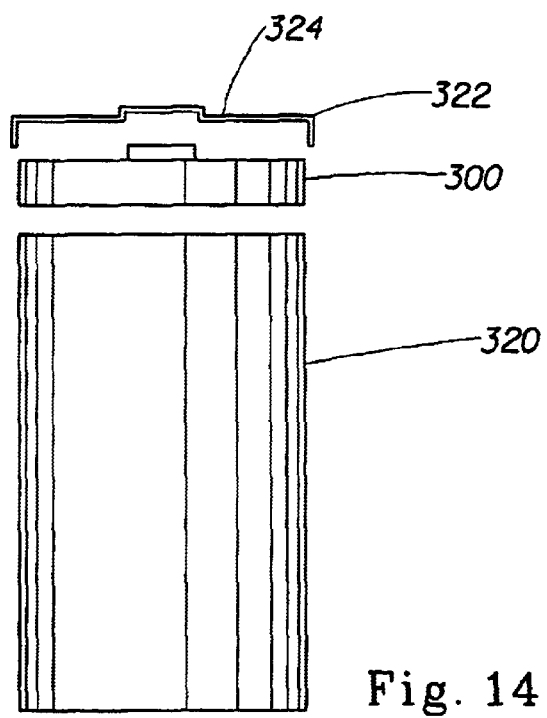
FIG. 14 shows a battery including an active package design of the present invention.

In an alternative embodiment, a power converter, regulator or charge pump circuits may be housed in an active package design of the present invention that is designed to fit under a false positive top or a false negative bottom of a battery. As shown in FIG. 13, for example, a charge pump active package 300 is designed to fit under the false positive top of a cylindrical battery (e.g., AA, AAA, C or D). In this embodiment, the storage capacitor 314, being the larger capacitor, forms the base of the active package 300 and provides a substrate on which a converter, regulator or charge pump integrated circuit, such as the charge pump integrated circuit 312, may be located. The flying capacitor 310 is narrower than the storage capacitor 314 and forms the top of the active package 300. As shown in FIG. 14, the narrower top of the active package 300 may be designed to fit within the dimple 324 of a false positive top 322 of a standard cylindrical battery 320. Alternatively, the shape of the active package 300 may be designed to fit in another location of a standard cylindrical battery or in another battery such as a prismatic, or other type of battery. Designs of power converters, regulators or charge pump circuits that may be used in the package of the present invention are described in U.S. application Ser. No. 09/054,192 entitled "Primary Battery Having a Built-In Controller to Extend Battery Run Time" and filed on Apr. 2, 1998 by Gartstein and Nebrigic, U.S. application Ser. No. 09/054,191 entitled "Battery Having a Built-In Controller to Extend Battery Service Run Time" and filed on Apr. 2, 1998 by Gartstein and Nebrigic, U.S. application Ser. No. 09/054,087 entitled "Battery Having a Built-In Controller" and filed on Apr. 2, 1998 by Gartstein and Nebrigic, U.S. application Ser. No. 09/054,012 entitled "Battery Having a Built-In Controller" and filed on Apr. 2, 1998 by Gartstein and Nebrigic, U.S. application Ser. No. 09/275,495 entitled "Battery Having a Built-In Controller" and filed on Mar. 24, 1999 by Gartstein and Nebrigic, U.S. Provisional Application No. 60/141,119 "Battery Having A Built-In Indicator" and filed on Apr. 23, 1999 by Nebrigic and Gartstein, each of which are incorporated by reference into this application.

In one embodiment, the flying capacitor 310 and the storage capacitor 314 may be high efficiency capacitors such as the ultra-capacitor coin cells described in Table 1 below. The ultra-capacitor coin cells may include two terminals on the same side of the capacitor in order to allow for easier connection in an active package of the present invention such as this embodiment or in other embodiments disclosed in this application.

Table 1

TABLE 1

| Technical Parameters | Flying Capacitor | Storage Capacitor |
|---|---|---|
| Capacitance | 0.05 F<br>(−10%, +25%) | 1 F<br>(−10%, +25%) |
| Series Resistance (25 C): | | |
| DC | <0.09 Ohms | <0.10 Ohms |
| 100 HZ | <0.08 Ohms | <0.08 Ohms |
| Voltage: | | |
| Continuous Voltage | 2.8 V | 2.8 V |
| Peak Voltage | 3.6 V | 3.6 V |
| Dimensions | 4 mm OD;<br>2 mm height | 6.5 mm OD;<br>2.5 mm height |
| Temperature | | |
| Operating | −20 C. to +60 C. | −20 C. to +60 C. |
| Storage | −40 C. to +80 C. | −40 C. to +80 C. |
| Leakage Current<br>(after 72 hrs) | 0.01 to 0.02 mA | 0.005 to 0.01 mA |

In one embodiment of the present invention, the active package may be formed into a standard integrated circuit package, such as a surface-mounted or wafer-scale package, in which one or more intrinsic components are incorporated into the active package in the same geometry as the standard integrated circuit package. In this way, the active package may replace all or part of the circuit that a standard passive package is used.

As shown in FIG. 22, multiple discrete components may be mated together to form a shell side of an active package of the present invention. In this embodiment, discrete components 1010 are mated together to form the top shell side 1020 of the active package 1000 such as for a microprocessor integrated circuit package. This top shell side 1020 may replace the passive package material of a typical microprocessor integrated circuit package (e.g., BGA-256) and allow for discrete components typically placed on a PCB board to be integrated into an active package 1000 of the present invention. The bottom carrier 1014 may include a typical pin carrier (e.g., BGA-256).

Figure 15:
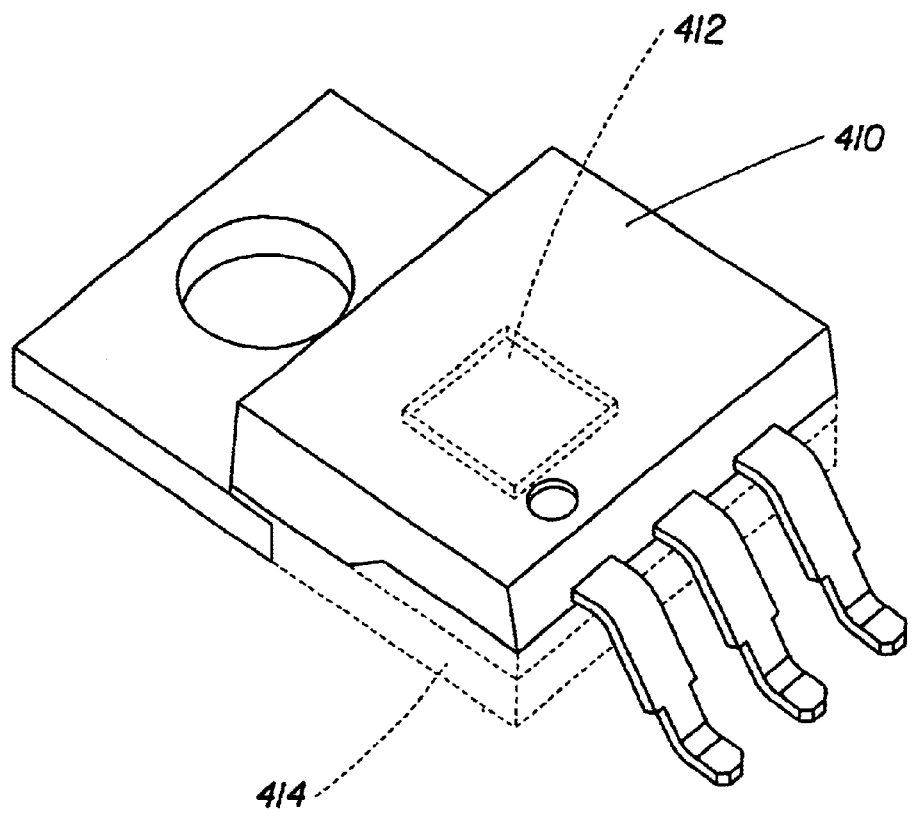
FIG. 15 shows yet another embodiment of an active package design of the present invention.

In on particular embodiment, the active package may include a fully integrated charge pump that is in a standard charge pump package form. The active package may be formed into a TO-220, SOT-223, TO-3, TO92, TO87, etc. standard form. FIG. 15, for example, shows an embodiment in which the active package is formed into a TO-220 standard form package. In this embodiment, the flying capacitor 410 and the storage capacitor 414 form the top and the bottom halves of the housing shell that encapsulates the integrated circuit 412. The flying capacitor 410 may be the same dimensions as the top of a standard TO-220 package. In the embodiment shown in FIG. 15, the storage capacitor 414 forms only a portion of the bottom half of the TO-220 package, and a metal, plastic or ceramic tab is attached to the storage capacitor to complete the bottom half of the standard package and to allow the package to be connected to a heat sink. In an alternative embodiment, the storage capacitor may be the same dimensions the bottom of a standard TO-220 package and may, if necessary, include a hole that allows for attachment of the package to a heat sink. In one embodiment, the flying capacitor 410 and the storage capacitor 412 may be high efficiency capacitors such as the ultra-capacitors described in Table 2 below.

Table 2

TABLE 2

| Technical Parameters | Flying Capacitor | Storage Capacitor |
| --- | --- | --- |
| Capacitance | 0.05 F<br>(−10%, +25%) | 1 F<br>(−10%, +25%) |
| Series Resistance (25 C): | | |
| DC | <0.09 Ohms | <0.10 Ohms |
| 100 HZ | <0.08 Ohms | <0.08 Ohms |
| Voltage: | | |
| Continuous Voltage | 2.8 V | 2.8 V |
| Peak Voltage | 3.6 V | 3.6 V |
| Dimensions | 8.38 mm ×<br>10.16 mm ×<br>2 mm | 26 mm ×<br>10.16 mm ×<br>2.45 to<br>2.65 mm |
| Temperature | | |
| Operating | −20 C. to +60 C. | −20 C. to +60 C. |
| Storage | −40 C. to +80 C. | −40 C. to +80 C. |
| Leakage Current<br>(after 72 hrs) | 0.01 to 0.02 mA | 0.005 to 0.01 mA |

Figure 16:
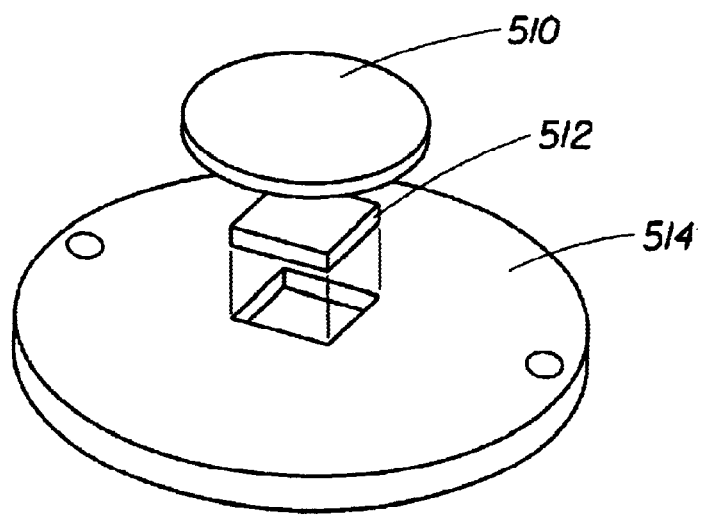
FIG. 16 shows a simplified exploded view of an alternative embodiment of the present invention.

FIG. 16 shows a simplified exploded view of an alternative embodiment of the present invention that may be used to replace a standard TO-3 package. The active package includes flying capacitor 510, integrated circuit 512 and storage capacitor 514.

Figure 17:
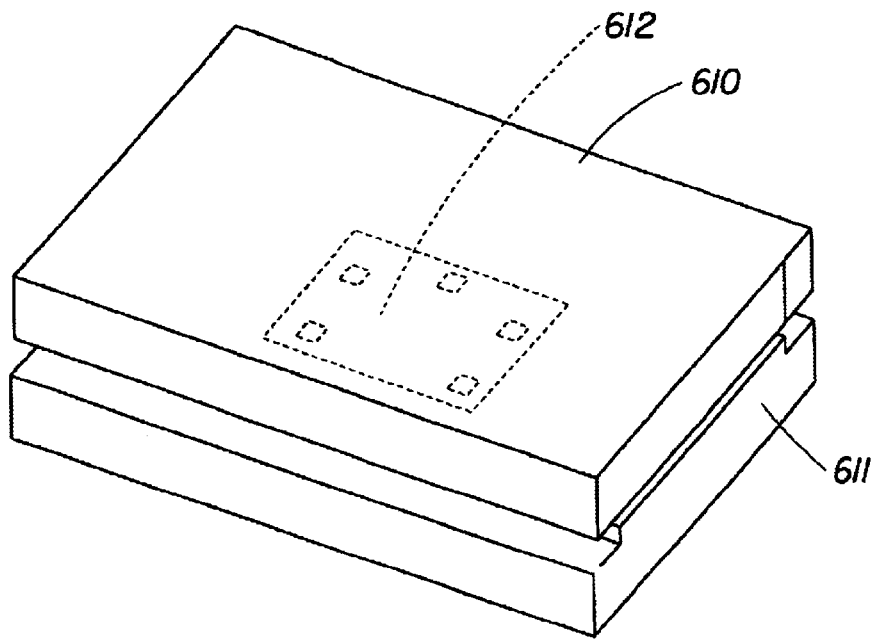
FIG. 17 shows a perspective view of an another embodiment of the present invention.
Figure 18:
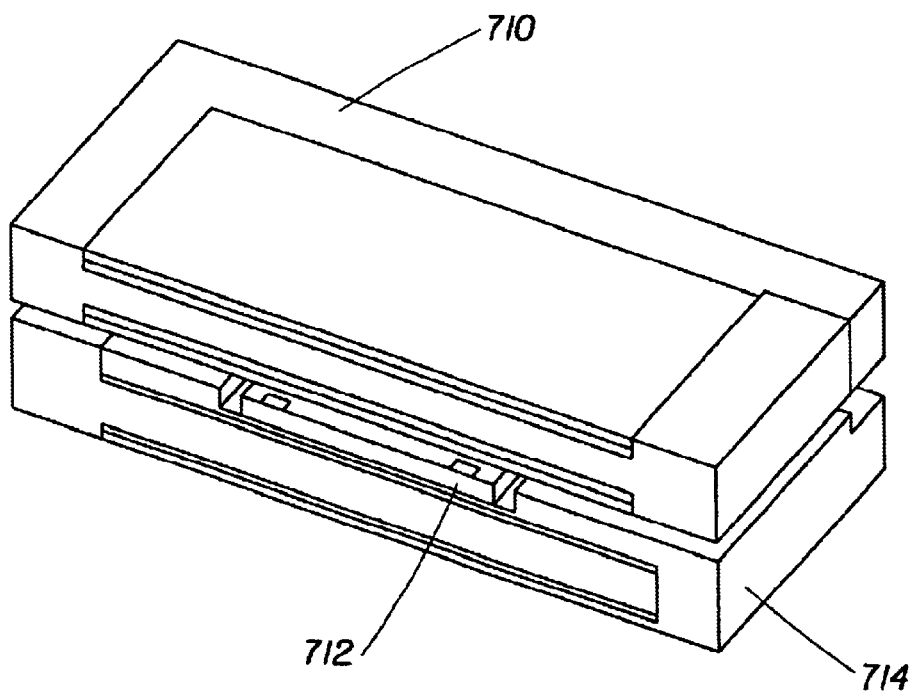
FIG. 18 shows a cut-away view of the embodiment of FIG. 17.

FIG. 17 shows a perspective view of an another embodiment of the present invention including discrete components 610 and 614, and integrated circuit 612. FIG. 18 shows a cut-away view of the embodiment of FIG. 17.

Figure 19:
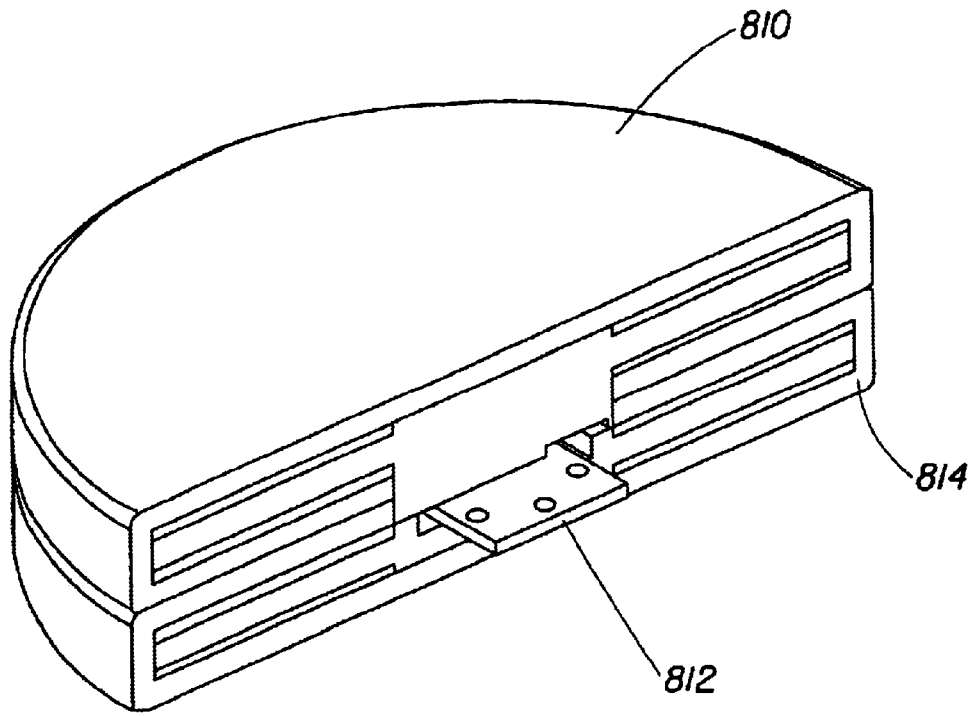
FIG. 19 shows a simplified cut-away view of an yet another embodiment of the present invention.
Figure 20:
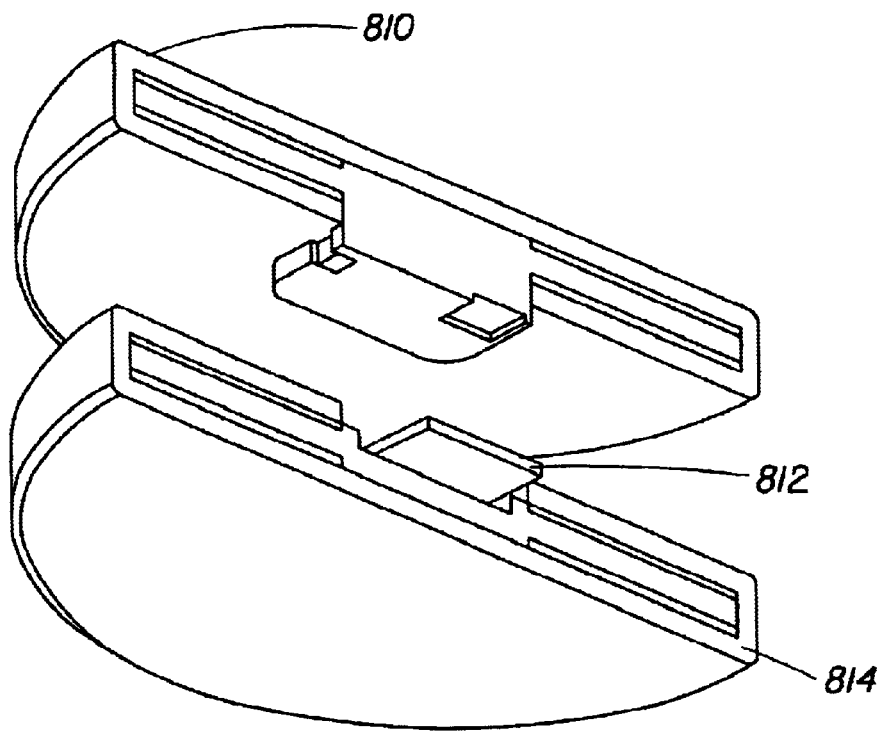
FIG. 20 shows a simplified exploded, cut-away view of the embodiment of FIG. 19.

FIG. 19 shows a simplified cut-away view of an yet another embodiment of the present invention. In this embodiment, the active package includes discrete components 810 and 814, and integrated circuit 812. FIG. 20 shows a simplified exploded, cut-away view of the embodiment of FIG. 19.

Figure 21:
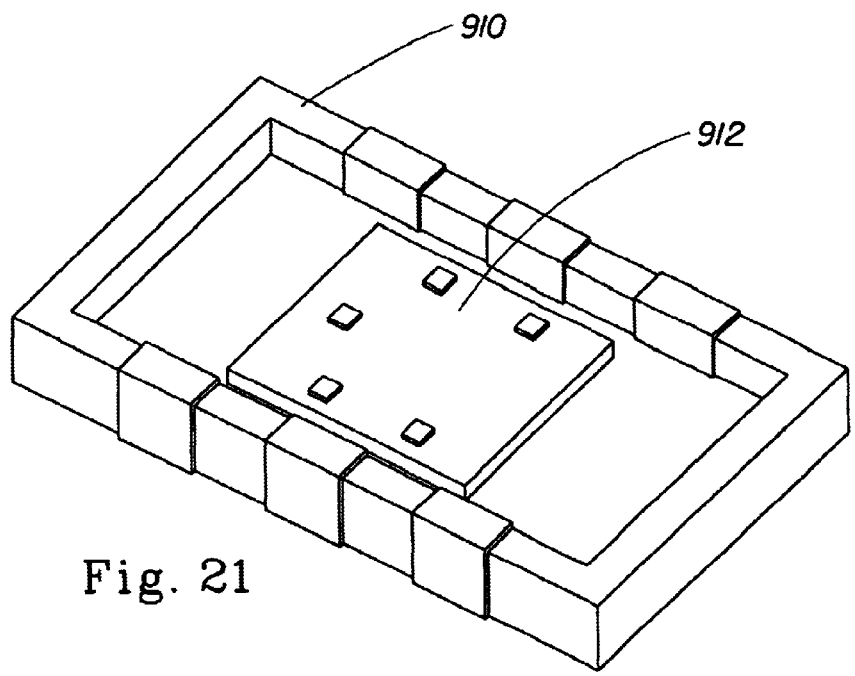
FIG. 21 shows a simplified perspective view of an another embodiment of the present invention.

FIG. 21 shows a simplified perspective view of an another embodiment of the present invention including a smart component. The smart component is shown without its housing and shows component 910, which may be a discrete component or a semiconductor component such as a silicon based resistor, capacitor or inductor.

What is claimed is:

1. An integrated circuit package comprising:
   (a) a package input terminal, a package output terminal and a package neutral terminal;
   (b) a discrete component electrically connected between either the package input terminal or the package output terminal and the package neutral terminal, preferably wherein the discrete component is selected from the group of: a tantalum capacitor, a high efficiency capacitor, an ultra capacitor, a super capacitor, a double layer electrolytic capacitor, a pseudo capacitor, non-linear magnetic inductor, and inductive bead, a resistor;
   (c) an integrated circuit including a first side, and a second side, an integrated circuit input terminal, an integrated circuit output terminal and an integrated circuit neutral terminal, the integrated circuit input terminal electrically connected to the package input terminal, the integrated circuit input terminal electrically connected to the package input terminal, the integrated circuit output terminal electrically connected to the package output terminal, and the integrated circuit neutral terminal electrically connected to the package neutral terminal;
   wherein the discrete component forms a first side of the package that protects the first side of the integrated circuit.

2. The integrated circuit package of claim 1, wherein the discrete component includes multiple discrete components attached together, preferably wherein the multiple discrete components are snap-fitted together.

3. The integrated circuit package of claim 1, wherein the discrete component and the integrated circuit are connected in series or in parallel between the package input terminal and the package output terminal.

4. The integrated circuit package of claim 1, wherein the discrete component comprises a first capacitor electrically connected between the package input terminal and the package neutral terminal, the integrated circuit package further comprising a second capacitor electrically connected between the package output terminal and the package neutral terminal, wherein the first capacitor forms a first side of the package, the second capacitor forms a second side of the package, and the integrated circuit is located between the first capacitor and the second capacitor, preferably wherein the integrated circuit comprises a power charge pump integrated circuit.

5. The integrated circuit package of claim 1, wherein the integrated circuit comprises a power charge pump integrated circuit.

6. The integrated circuit package of claim 1, further comprising a battery having: a container including a positive terminal and a negative terminal, and an electrochemical cell including a positive electrode and a negative electrode, the integrated circuit package being electrically connected between the positive and negative electrodes of the electrochemical cell and the positive and negative terminals of the container.

7. The integrated circuit package of claim 1, wherein the integrated circuit package is sized to fit inside a false top of a standard-sized cylindrical battery.

8. The integrated circuit package of claim 4, wherein the first capacitor includes multiple capacitors attached together.

9. The integrated circuit package of claim 8, wherein the integrated circuit package comprises a single component power integrator, preferably wherein the single component power integrator integrated circuit includes only 3 terminals and/or the single component power controller is a standard-package power controller package construction.

10. The integrated circuit package of claim 9, wherein the first capacitor and/or the second capacitor is an ultra capacitor.

11. The integrated circuit package of claim 10, wherein the integrated circuit package is a solderless construction.

* * * * *

UNITED STATES PATENT AND TRADEMARK OFFICE
CERTIFICATE OF CORRECTION

PATENT NO. : 6,731,512 B2
DATED : May 4, 2004
INVENTOR(S) : Nebrigic et al.

It is certified that error appears in the above-identified patent and that said Letters Patent is hereby corrected as shown below:

Title page,
Item [73], Assignee, should read -- The Board of Trustees of the University of Illinois Chicago, IL (US) --

Signed and Sealed this

Nineteenth Day of April, 2005

JON W. DUDAS
*Director of the United States Patent and Trademark Office*